US008916972B2

(12) United States Patent
Lin et al.

(10) Patent No.: US 8,916,972 B2
(45) Date of Patent: Dec. 23, 2014

(54) ADHESION BETWEEN POST-PASSIVATION INTERCONNECT STRUCTURE AND POLYMER

(71) Applicant: Taiwan Semiconductor Manufacturing Company, Ltd., Hsin-Chu (TW)

(72) Inventors: Jing-Cheng Lin, Hsin-Chu (TW); Jui-Pin Hung, Hsin-Chu (TW); Min-Chen Lin, Tainan (TW); Yi-Hang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/800,653

(22) Filed: Mar. 13, 2013

(65) Prior Publication Data
US 2014/0264853 A1 Sep. 18, 2014

Related U.S. Application Data

(60) Provisional application No. 61/777,634, filed on Mar. 12, 2013.

(51) Int. Cl.
H01L 23/48 (2006.01)
H01L 21/44 (2006.01)
H01L 23/00 (2006.01)

(52) U.S. Cl.
CPC ............... *H01L 24/13* (2013.01); *H01L 24/11* (2013.01)
USPC ............................ 257/738; 257/686; 438/614

(58) Field of Classification Search
CPC ...... H01L 23/488; H01L 21/28; H01L 23/485
USPC .................. 257/686, 777, 738; 361/783, 760; 438/614
See application file for complete search history.

(56) References Cited

U.S. PATENT DOCUMENTS

| 8,456,856 B2 * | 6/2013 | Lin et al. ........................ 361/783 |
| 8,647,925 B2 * | 2/2014 | Chiou et al. ................... 438/109 |
| 2010/0246152 A1 * | 9/2010 | Lin et al. ........................ 361/783 |

OTHER PUBLICATIONS

Topper, M., et al., "A Comparison of Thin Film Polymers for Wafer Level Packaging," Electronic Components and Technology Conference, Jun. 1-4, 2010, pp. 769-776.

* cited by examiner

*Primary Examiner* — Theresa T Doan
(74) *Attorney, Agent, or Firm* — Slater & Matsil, L.L.P.

(57) ABSTRACT

An embodiment integrated circuit structure includes a substrate, a metal pad over the substrate, a post-passivation interconnect (PPI) structure over the substrate and electronically connected to the metal pad, a thin oxide film layer directly over a top surface of the PPI structure, and a polymer layer over the thin oxide film layer and PPI structure.

20 Claims, 6 Drawing Sheets

ADHESION BETWEEN POST-PASSIVATION INTERCONNECT STRUCTURE AND POLYMER

This application claims the benefit of U.S. Provisional Application No. 61/777,634 filed on Mar. 12, 2013, entitled "Improved Adhesion Between Post-Passivation Interconnect Structure and Polymer", which application is hereby incorporated herein by reference.

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, bond pads are formed and exposed on the surface of the respective die. Electrical connections are made through the bond pads to connect the die to a package substrate or another die.

In certain categories of conventional packaging technologies, such as fan-out wafer level packaging (FO-WLP), a post-passivation interconnect (PPI) structure (also known as redistribution layers (RDLs)) may be formed over the passivation layers of a die and electrically connected to the bond pads. This is followed by the formation of a polymer layer and under bump metallurgies (UBMs). The UBMs are formed in openings penetrating through the second polymer and electrically connected to the PPI structure. I/O pads such as solder balls may then be placed on the UBMs.

An advantageous feature of this packaging technology is the possibility of forming fan-out packages, which means the I/O pads on a die can be redistributed to a greater area than the die, and hence the number of I/O pads packed on the surfaces of the dies can be increased. However, an issue with this packaging technology is reliability concerns regarding delamination between the PPI and the polymer layer. Delamination issues have been observed in typical FO-WLP wafers subject to various durability tests, such as a PCT-168 hrs test, wherein the wafer is stressed under a high heat, pressure, and humidity condition for 168 hours. These delamination issues may further cause I/O pad breakages in the integrated circuit.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to a specific context, namely a fan-out wafer level packaging (FO-WLP) technology. Other embodiments may also be applied, however, to other packaging technologies such as wafer level chip scale packaging (WLCSP) or interposers having redistribution layers (RDLs).

FIGS. 1-7 illustrate cross-sectional views of various stages of manufacturing an integrated circuit structure according to various embodiments. A post-passivation interconnect (PPI) structure is formed over a wafer to redistribute or redirect I/O pads in the wafer to a larger or different area. A thin oxide film layer is advantageously formed over the PPI structure. A polymer layer is formed over the thin oxide film, followed by the formation of under bump metallurgies (UBMs) and solder bumps electrically connected to the PPI structure. The thin oxide film layer improves adhesion between the PPI structure and the polymer layer.

Figure 1:
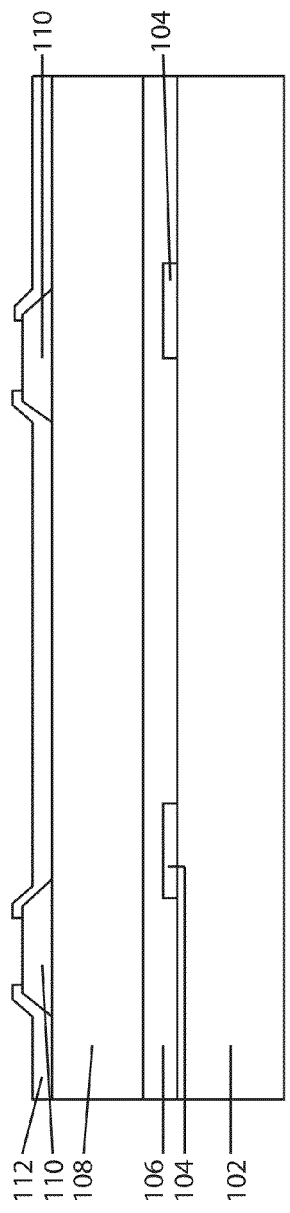
FIGS. 1-7 are cross-sectional views of intermediate stages of manufacture of an integrated circuit structure in accordance with various embodiments.

FIG. 1 illustrates a side view of a die 100, which includes substrate 102. Substrate 102 may be a bulk silicon substrate although other semiconductor materials including group III, group IV, and group V elements may also be used. Active devices 104 such as transistors may be formed on the top surface of substrate 102. An inter-layer dielectric (ILD) 106 is formed over substrate 102, and various inter-metal dielectric layers (IMDs) 108 are formed over ILD 106. ILD 106 and IMDs 108 may be formed of low-k dielectric materials having k values, for example, lower than about 4.0. ILD 106 and IMDs 108 may be made of, for example, silicon oxide, SiCOH, and the like.

Metal pads 110 are formed over IMDs 108 and are electrically coupled to active devices 104 through various metallic lines and vias (not shown) in IMDs 108. Metal pads 110 may be aluminum pads, although other metallic materials may be used. Passivation layer 112 is formed over IMDs 108 and may be formed of non-organic materials such as silicon oxide, un-doped silicate glass, silicon oxynitride, and the like. Openings are formed in portions of passivation layer 112 that cover metal pads 110, exposing central portions of metal pads 110. Portions of passivation layer 112 may also cover edge portions of metal pads 110. The formation details of the various features in FIG. 1 are well known in the art and not described herein.

Figure 2:
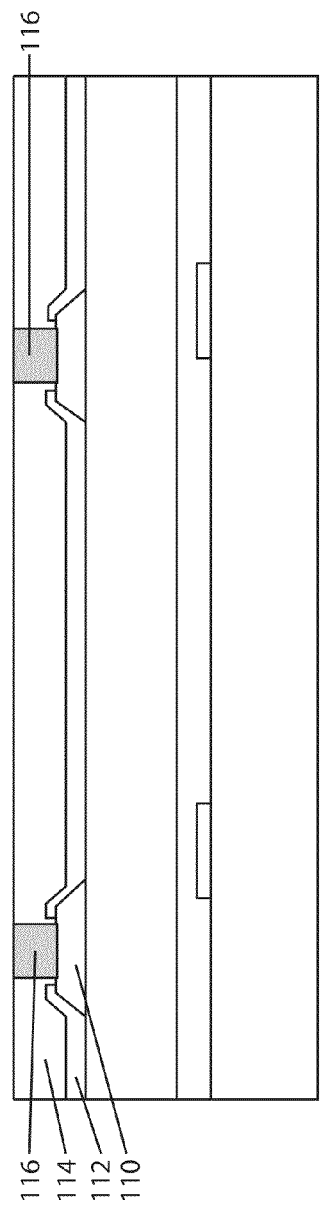

FIG. 2 illustrates the formation of a first polymer layer 114 over passivation layer 112. Polymer layer 114 may be formed of a material such as polyimide (PI), polybenzoxazole (PBO), benzocyclobuten (BCB), epoxy, silicone, acrylates, nano-filled pheno resin, siloxane, fluorinated polymer, polynorbornene, and the like. Polymer layer 114 is patterned to expose portions of metal pads 110 using, for example, a combination of photolithographic techniques and etching. Post-passivation interconnect (PPI, so named because they are formed after the formation of passivation layer 112) pads 116 may be formed on and electrically connect to metal pads 110 through the openings in passivation layer 112 and polymer layer 114. PPI pads 116 may alternatively be referred to as redistribution layer (RDL) pads. Polymer layer 114 may be formed using, for example, spin on coating techniques.

Figure 3:
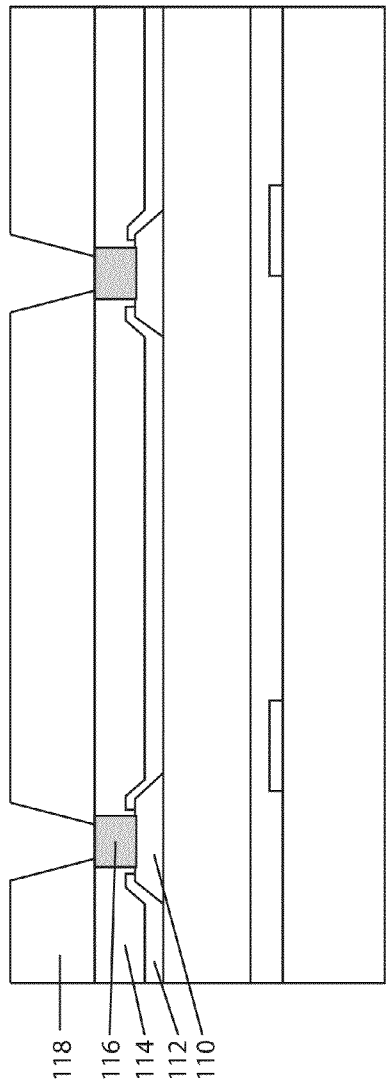

FIG. 3 shows the formation of a second polymer layer 118 over polymer layer 114. Polymer layer 118 may be formed of the same material as polymer layer 114 using the same methods. Polymer layer 118 may be patterned to expose portions of PPI pads 116 using the same methods as the methods used in patterning polymer layer 114.

Figure 4:
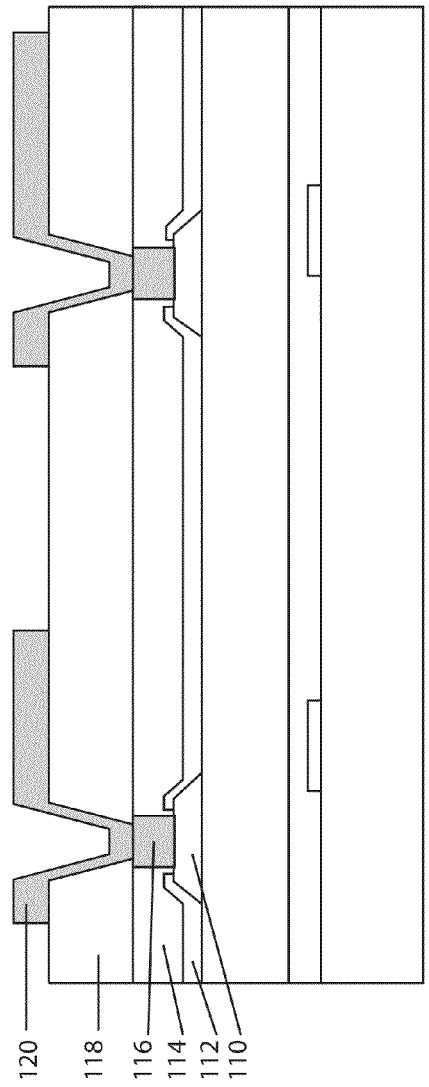

FIG. 4 shows the formation of PPI structure 120. PPI structure 120 may also be referred to as RDL 120 because it allows I/O pads on die 100 to be redistributed to a greater area than die 100. PPI structure 120 may alternatively be used to route electrical connections to a different region of die 100. PPI structure 120, including PPI pad 116, may be formed of copper or a copper alloy although other metals such as aluminum or gold may be used. The formation methods of PPI structure 120 and PPI pad 116 may include plating, electroless plating, sputtering, chemical vapor deposition (CVD), and the like. Usually an opening is filled with the metal and surface of the substrate covered by the process. Excess metal is then removed. The surface may be planarized in a chemical mechanical polishing (CMP) process. Patterned etch may also be used. In some embodiments, PPI structure 120 and PPI pad 116 may be formed in the same process step. While FIG. 4 shows PPI structure 120 having only one PPI line; however in alternative embodiments, PPI structure 120 may include multiple PPI lines formed in multiple polymer layers.

Figure 5:
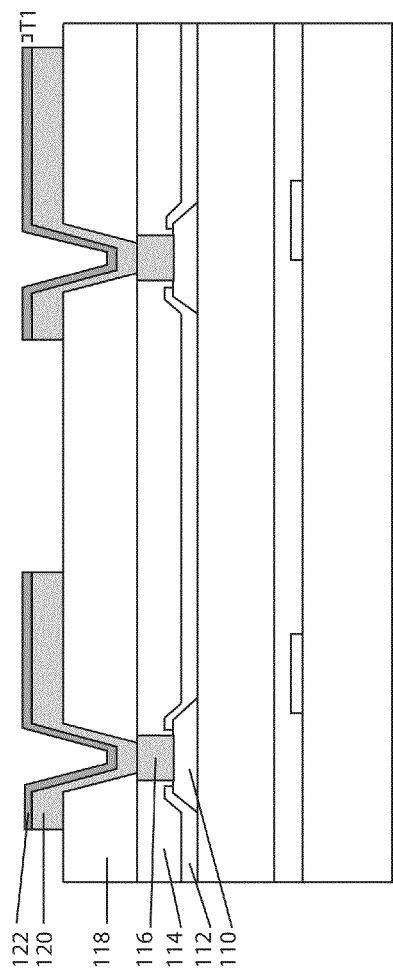

FIG. 5 illustrates the formation of thin oxide layer 122 over and covering the top surface of PPI structure 120. In an embodiment, thin oxide layer 122 is formed by applying an oxygen plasma treatment to PPI structure 120. For example, PPI structure 120 may be formed of copper. The top surface of PPI structure 120 may be exposed to an oxygen containing plasma. This may be done by exciting oxygen gas using, for example, microwaves to ionize oxygen gas and form oxygen radicals. Therefore, the creation of oxygen plasma introduces oxygen ions over copper PPI structure 120. A voltage may be applied under the substrate attracting the oxygen ions and causing the oxygen ions to react with the copper metal on the PPI structure 120. Thus, a thin copper oxide layer 122 is formed. The thin copper oxide layer 122 includes both cuprous oxide ($Cu_2O$) and cupric oxide (CuO). Thin oxide layer 122 is an oxide of the metal material used in forming the underlying PPI structure 120. In some embodiments, exposed surfaces of the second polymer layer 118 are protected by a mask, for example, a photoresist, from the oxygen plasma. In other embodiments, the second polymer layer 118 is subjected to the same oxidizing conditions as the PPI structure 120.

In other embodiments, the thin oxide layer 122 may be formed by exposing the PPI structure 120 on the substrate to ozone. Ozone is a metastable form of oxygen that may be generated in a microwave or UV generator and which readily dissociates into $O_2$ and the oxygen radical O*. The ozone may be generated remotely from the substrate and be flowed over to the substrate without subjecting the substrate to plasma. In alternative embodiments, the thin oxide layer 122 may be formed using a wet chemical treatment. For example, an acid such as hydrogen peroxide ($H_2O_2$) and/or other oxidizers may be applied over PPI structure 120. The acid interacts with and oxidizes the metallic material of the PPI structure to form thin oxide layer 122. Again, the composition of thin oxide layer 122 depends on the material used in forming PPI structure 120. In some embodiments, exposed surfaces of the second polymer layer 118 are protected by a mask, for example, a photoresist, during the oxidization. In other embodiments, the second polymer layer 118 is subjected to the same oxidizing conditions as the PPI structure 120.

Thin oxide layer 122 may have a thickness T1 greater than about 10 nm and less than about 200 nm. In comparison, the native oxide that may be present in pre-existing PPI structures (e.g., copper oxide in a copper PPI), as is known in the art, generally has a thickness less than 5 nm.

Figure 6:
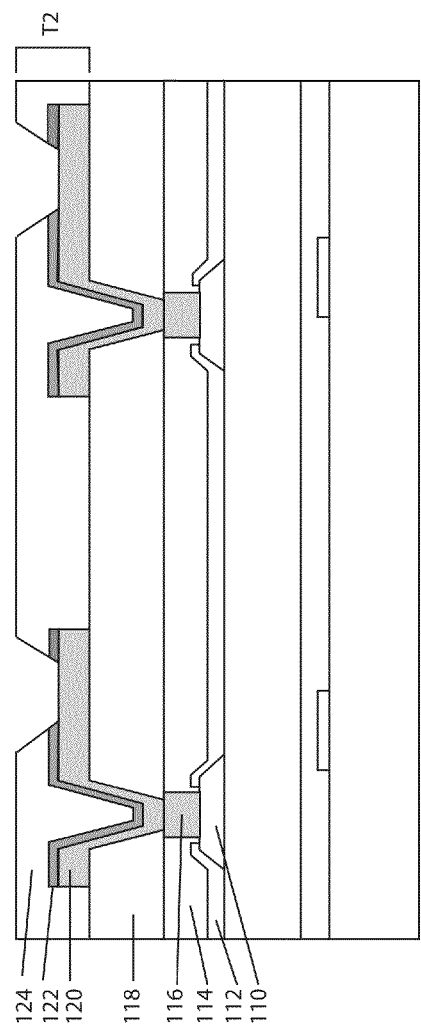

FIG. 6 shows the formation of a third polymer layer 124 over PPI structure 120 and thin oxide layer 122. Polymer layer 124 may be formed of the same materials and using the same techniques as polymer layers 114 and 118 (e.g., polymer layer 124 may be formed of PBO using spin-on coating techniques). Polymer layer 124 may have a thickness T2 of about 5 μm to 10 μm. By forming thin oxide layer 122 between PPI structure 120 and polymer layer 124, adhesion between PPI structure 120 and polymer 124 is improved. For example, after subjecting various integrated circuits to the same PCT-168 hour reliability test as previously described, substantially fewer delamination issues between polymer layer 124 and PPI structure 120 were observed in integrated circuits having a thin oxide film layer. In one test, a 50% reduction in delamination instances was observed. Thus, delamination issues between polymer layer 124 and PPI structure 120 were substantially eliminated in integrated circuits with thin oxide film layers having a thickness of greater than about 10 nm.

Figure 7:
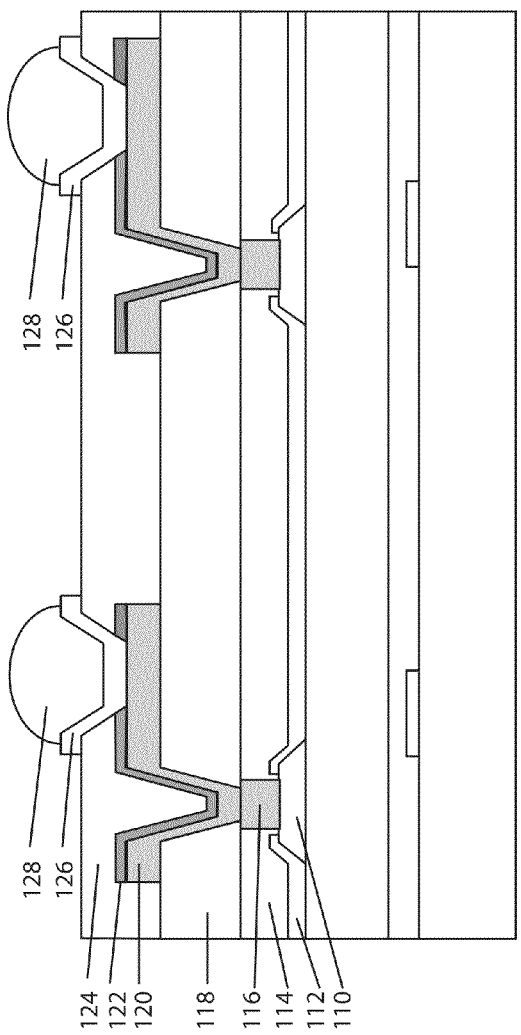

Polymer layer 124 and thin oxide layer 122 are patterned to form openings exposing PPI structure 120. FIG. 7 illustrates the formation of under bump metallurgies (UBMs) 126 to extend into the openings in polymer layer 124 and contact PPI structure 120. UBMs 126 may be formed of conductive materials such as copper, copper alloys, titanium, titanium alloys, or the like. Bond balls 128 are formed on UBMs 126, and may be solder balls, copper pillars, and the like. Bond balls 128 are formed to electrically connect and bond to other package components such as a device die, an interposer, a printed circuit board (PCB), and the like.

Figure 8:
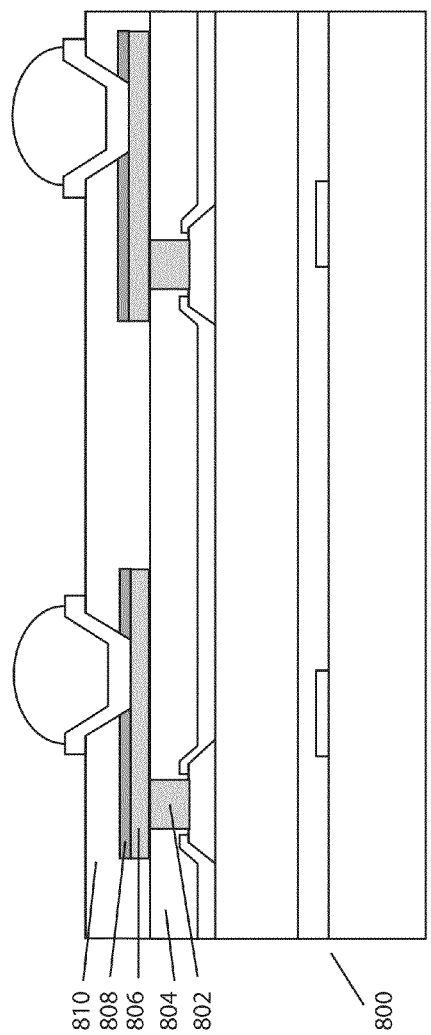
FIG. 8 is a cross sectional of an integrated circuit structure in accordance with an alternate embodiment.

FIG. 8 illustrates an alternative embodiment showing an integrated circuit 800. Integrated circuit 800 is substantially similar to the integrated circuit shown in FIGS. 1-7, but integrated circuit 800 omits polymer layer 118. PPI structure 806 may be a single metallic line formed directly over PPI pads 802 in polymer layer 804. Thin oxide film layer 808, polymer layer 810, UBMs, and bond balls are be formed over PPI structure 806, These features are substantially the same as the ones described previously in FIGS. 1-7.

Figure 9:
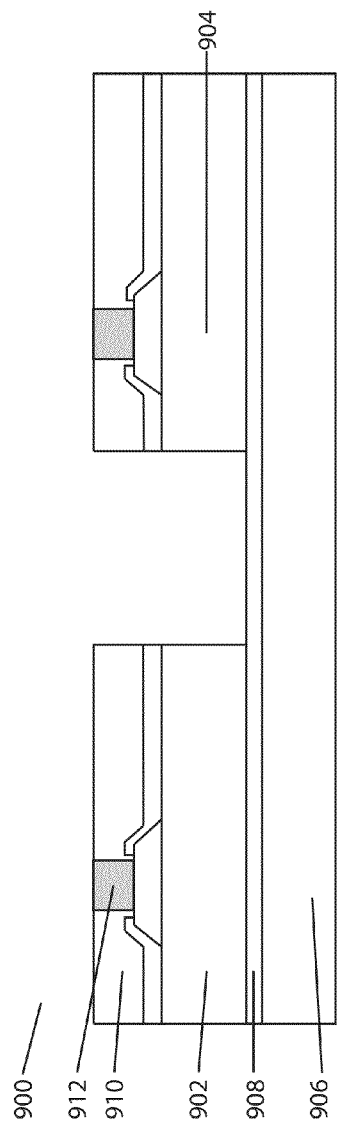
FIGS. 9-11 are cross-sectional views of various stages of manufacture of an integrated circuit structure in accordance with alternate embodiments.

FIGS. 9-12 show various stages of manufacturing an integrated circuit structure according to alternative embodiments. Integrated circuit 900 includes multiple dies 902 and 904 substantially similar to die 100 in FIGS. 1-7. A polymer layer 910 is formed over dies 902 and 904. Polymer layer 910 includes PPI pads 912, which are electrically connected to metal pads in dies 902 and 904. In FIG. 9, dies 902 and 904 are disposed over a carrier 906 via an adhesive layer 908. Adhesive layer 908 may be formed of a glue, and carrier 906 may be made of glass.

Figure 10:
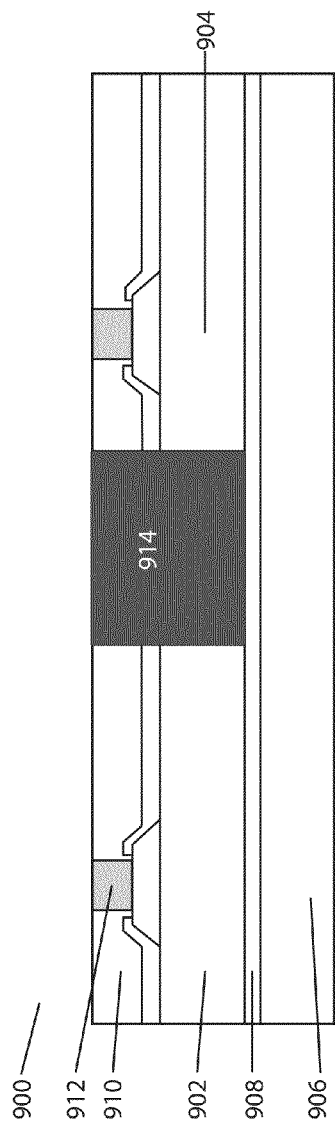

FIG. 10 illustrates the filling of molding compound 914 into the spaces between dies 902 and 904. Molding compound 914 may be an organic material such as an epoxy, which may be filled between dies 902 and 904 in liquid form. Subsequently, a curing process is performed to solidify molding compound 914. A planarization, such as a grinding may be performed on molding compound 914 so that its top surface may be substantially level with dies 902 and 904.

Figure 11:
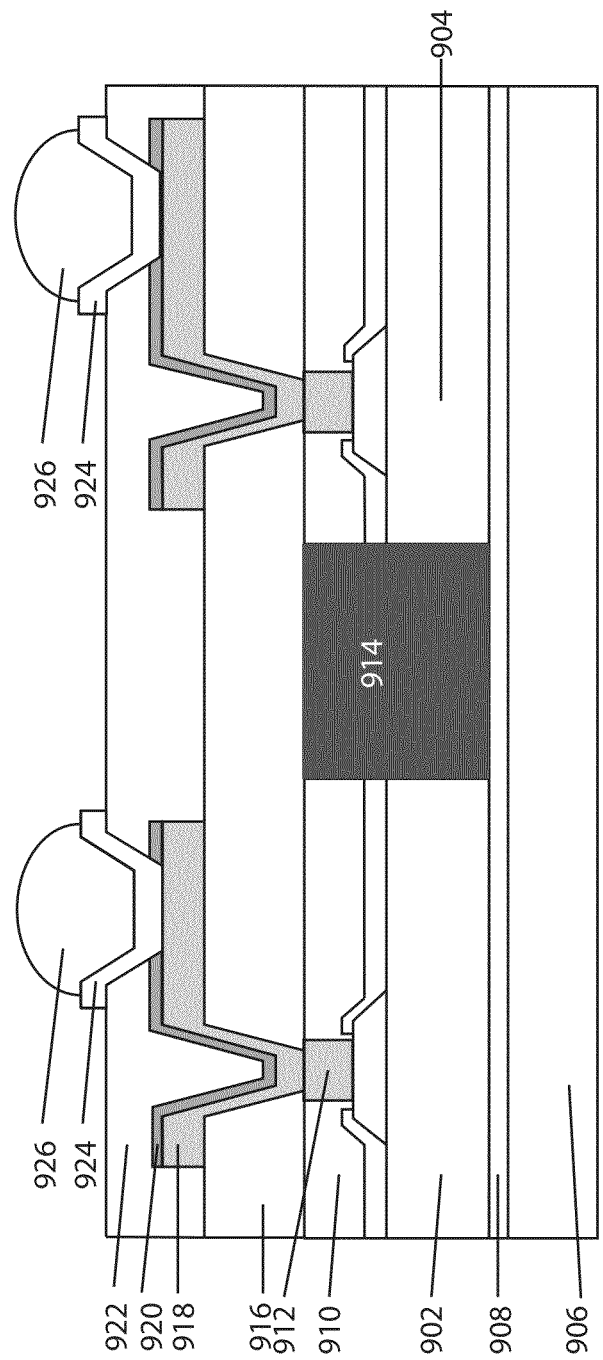

FIG. 11 illustrates the formation of subsequent polymer layers 916 and 922, RDL 918 (previously referred to as PPI structure), thin oxide film layer 920, UBMs 924, and bond balls 926. These features are substantially similar to those previously discussed in FIGS. 1-7. Carrier 906 and adhesive layer 908 may be removed in a subsequent process step. In this manner, multiple dies may be packaged together to form FO-WLP including a thin oxide film layer that advantageously improves adhesion between the RDLs and an overlaying polymer layer.

In accordance with a first embodiment, an integrated circuit structure includes a substrate, a metal pad over the substrate, a post-passivation interconnect (PPI) structure over the substrate and electronically connected to the metal pad, a thin oxide film layer directly over a top surface of the PPI structure, and a polymer layer over the thin oxide film layer and PPI structure.

In accordance with another embodiment, an integrated circuit structure includes a a first die, wherein the first die includes a metal pad, a redistribution layer (RDL) structure overlaying the first die, wherein the RDL structure is electrically connected to the metal pad, a thin oxide film layer overlaying a top surface of the RDL structure, a polymer layer overlaying the thin oxide film layer and the RDL structure, a under bump metallurgy (UBM) formed in an opening in the polymer layer and electrically connected the RDL structure, and a conductive bump in the UBM.

In accordance with yet another embodiment, a method for forming an integrated circuit structure includes forming a post-passivation interconnect (PPI) structure over a substrate, wherein the substrate comprises a metal pad and the PPI structure is electrically connected to the metal pad, oxidizing a top surface of the PPI structure, and forming a polymer layer over the PPI structure.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit structure comprising:
    a substrate;
    a metal pad over the substrate;
    a passivation layer over the substrate and covering an edge portion of the metal pad;
    a post-passivation interconnect (PPI) structure over the passivation layer and electronically connected to the metal pad;
    a thin oxide film layer directly over a top surface of the PPI structure; and
    a polymer layer over the thin oxide film layer and PPI structure.

2. The integrated circuit structure of claim 1, wherein the thin oxide film layer has a thickness greater than about ten nanometers.

3. The integrated circuit structure of claim 1, wherein the thin oxide film layer has a thickness less than about two hundred nanometers.

4. The integrated circuit structure of claim 1, wherein the polymer layer has a thickness of about five to ten micrometers.

5. The integrated circuit structure of claim 1, wherein the PPI structure comprises copper, and the thin oxide film layer comprises copper oxide.

6. The integrated circuit structure of claim 1, wherein the polymer layer is selected from a group consisting of polyimide (PI), polybenzoxazole (PBO), benzocyclobuten (BCB), epoxy, silicone, acrylates, nano-filled pheno resin, siloxane, fluorinated polymer, polynorbornene, and combinations thereof.

7. The integrated circuit structure of claim 1, further comprising:
    an under bump metallurgy (UBM) extending into an opening in the polymer layer and the thin oxide film layer, wherein the UBM is electrically connected to the PPI structure; and
    a bond ball on the UBM.

8. An integrated circuit structure comprising:
    a first die, wherein the first die comprises:
        a metal pad at a top surface of the first die; and
        a passivation layer covering an edge portion of the metal pad;
    a redistribution layer (RDL) structure over the first die, wherein the RDL structure is electrically connected to the metal pad;
    a thin oxide film layer over a top surface of the RDL structure;
    a polymer layer over the thin oxide film layer and the RDL structure;
    an under bump metallurgy (UBM) over the polymer layer and electrically connected the RDL structure; and
    a conductive bump on the UBM.

9. The integrated circuit structure of claim 8, wherein the thin oxide film layer has a thickness greater than about ten nanometers.

10. The integrated circuit structure of claim 8, wherein the polymer layer is selected from a group consisting of polyimide (PI), polybenzoxazole (PBO), benzocyclobuten (BCB), epoxy, silicone, acrylates, nano-filled pheno resin, siloxane, fluorinated polymer, polynorbornene, and combinations thereof.

11. The integrated circuit structure of claim 8, wherein the RDL structure comprises a metallic material, and the thin oxide film layer comprises an oxide of the metallic material.

12. The integrated circuit structure of claim 8, further comprising a molding compound separating the first die from a second die in the integrated circuit structure.

13. The integrated circuit of claim 8, wherein the RDL structure comprises one or more RDL lines and RDL pads.

14. A method for forming an integrated circuit structure comprising:
    forming a post-passivation interconnect (PPI) structure over a substrate, wherein the substrate comprises a metal pad and the PPI structure is electrically connected to the metal pad;
    oxidizing a top surface of the PPI structure; and
    forming a polymer layer over the PPI structure.

15. The method of claim 14, wherein oxidizing a top surface of the PPI structure comprises an oxygen plasma treatment.

16. The method of claim 14, wherein the oxygen plasma treatment comprises:
    exposing the top surface of the PPI structure to an oxygen plasma, wherein the oxygen plasma is created by exciting oxygen gas over the PPI structure; and
    applying a voltage under the substrate.

17. The method of claim 14, wherein oxidizing a top surface of the PPI structure comprises treating the substrate with a wet chemical.

18. The method of claim 14, wherein the oxidizing a top surface of the PPI structure creates a thin oxide film layer having a thickness greater than about ten nanometers.

19. The method of claim 18, further comprising:
- patterning an opening in the polymer layer and the thin oxide film layer, wherein the opening exposes a portion of the PPI structure;
- forming an under bump metallurgy (UMB), wherein at least a portion of the UMB extends into the opening in the polymer layer and the thin oxide film layer and is electrically connected to the PPI structure; and
- forming a bond ball on the UMB.

20. The method of claim 18, wherein the PPI structure comprises copper, the thin oxide film layer comprises copper oxide, and the polymer layer is selected from a group consisting of polyimide (PI), polybenzoxazole (PBO), benzocyclobuten (BCB), epoxy, silicone, acrylates, nano-filled pheno resin, siloxane, fluorinated polymer, polynorbornene, and combinations thereof.

* * * * *